United States Patent
Simon et al.

(10) Patent No.: US 9,115,438 B2
(45) Date of Patent: Aug. 25, 2015

(54) METHOD FOR THE ELECTROLYTIC PRODUCTION OF SELF-SUPPORTING CONDUCTIVE NANOCOMPOSITE ELEMENTS

(75) Inventors: Patrice Simon, Toulouse (FR);
Pierre-Louis Taberna, Roques sur Garonne (FR); Jean-Marie Tarascon, Mennecy (FR); Jean-Pascal Cambronne, Ramonville Saint-Agne (FR); Thierry Lebey, Lacroix Falgarde (FR)

(73) Assignees: Universite de Picardie Jules Verne, Amiens (FR); Universite Paul Sabatier (Toulouse III), Toulouse (FR)

( * ) Notice: Subject to any disclaimer, the term of this patent is extended or adjusted under 35 U.S.C. 154(b) by 1938 days.

(21) Appl. No.: 11/920,624

(22) PCT Filed: May 16, 2006

(86) PCT No.: PCT/FR2006/001099
§ 371 (c)(1),
(2), (4) Date: Apr. 13, 2009

(87) PCT Pub. No.: WO2006/123049
PCT Pub. Date: Nov. 23, 2006

(65) Prior Publication Data
US 2009/0316335 A1    Dec. 24, 2009

(30) Foreign Application Priority Data
May 18, 2005   (FR) ................................... 05 04960

(51) Int. Cl.
*C25D 1/04*       (2006.01)
*C25D 5/02*       (2006.01)
(Continued)

(52) U.S. Cl.
CPC ............... *C25D 5/022* (2013.01); *C25D 1/006* (2013.01); *C25D 1/04* (2013.01); *C25D 3/02* (2013.01);
(Continued)

(58) Field of Classification Search
CPC .......... C25D 1/006; C25D 1/04; H01G 11/24; H01G 11/26; H01G 11/30; H01M 4/70; H01M 4/75
USPC .......................... 205/105, 122, 173, 135, 118
See application file for complete search history.

(56) References Cited

U.S. PATENT DOCUMENTS 3,953,234 A * 4/1976 Hoffmann ..................... 429/199
4,155,818 A * 5/1979 Campbell et al. ............. 205/417
(Continued)

FOREIGN PATENT DOCUMENTS

WO   WO 2005/040460    *   5/2005

OTHER PUBLICATIONS

Y. Konishi et al, "Electrodeposition of cu nanowire arrays with a template", Journal of Electroanalytical Chemistry, vol. 559, pp. 149-153, 2003.*

(Continued)

*Primary Examiner* — Bryan D. Ripa
(74) *Attorney, Agent, or Firm* — Melissa M. Hayworth; E. Joseph Gess

(57) ABSTRACT

The invention relates to a self-supporting composite element and to a method of producing same. The composite element comprises a substrate of electronic conductive material which is covered with metal nanowires that are essentially oriented along a plane that is perpendicular to the substrate. The element is produced in a cell comprising a cathode which is formed by the substrate to be covered, one or more anodes and an electrolyte which is formed by a solution of a precursor of the metal material and optionally containing a conductive ionic salt, a flat porous membrane which is placed between the cathode and each of the anodes and a spacer element between each membrane and the anode adjacent thereto, the different constituent parts of the cell being maintained in contact.

15 Claims, 2 Drawing Sheets

(51) Int. Cl.
  *C25D 3/02*   (2006.01)
  *C25D 7/00*   (2006.01)
  *H01M 4/134*   (2010.01)
  *H01M 4/66*   (2006.01)
  *H01M 4/70*   (2006.01)
  *H01M 4/75*   (2006.01)
  *H01G 11/30*   (2013.01)
  *C25D 1/00*   (2006.01)
  *H01M 4/58*   (2010.01)
  *H01M 10/052*   (2010.01)
  *C25D 11/04*   (2006.01)

(52) U.S. Cl.
  CPC .............. *C25D 7/00* (2013.01); *H01G 11/30* (2013.01); *H01M 4/134* (2013.01); *H01M 4/661* (2013.01); *H01M 4/70* (2013.01); *H01M 4/75* (2013.01); *C25D 11/045* (2013.01); *H01L 2924/0002* (2013.01); *H01M 4/5825* (2013.01); *H01M 10/052* (2013.01); *Y02E 60/122* (2013.01); *Y02E 60/13* (2013.01); *Y10T 428/1241* (2015.01); *Y10T 428/12438* (2015.01)

(56) References Cited

U.S. PATENT DOCUMENTS

| | | | | |
|---|---|---|---|---|
| 5,300,199 A | * | 4/1994 | Fyson | 205/337 |
| 7,267,859 B1 | * | 9/2007 | Rabin et al. | 428/131 |
| 7,553,401 B2 | * | 6/2009 | Gebhart et al. | 205/96 |
| 2005/0062033 A1 | | 3/2005 | Ichihara et al. | |
| 2005/0089638 A1 | | 4/2005 | Chopra | |
| 2007/0284257 A1 | * | 12/2007 | Fukunaka et al. | 205/239 |

OTHER PUBLICATIONS

F. A. Lowenheim, Electroplating, McGraw-Hill Book Co., New York, 1978, pp. 115-116, 194.*

Y. Konishi et al., "Electrodeposition of Cu Nanowire Arrays with a Template", Journal of Electroanalytical Chemistry, vol. 559, pp. 149-153, 2003.

Wu Xiaodong et al., "Agglomeration and the Surface Passivating Film of Ag Nano-brush Electrode in Lithium Batteries", Solid State Ionics, vol. 149, pp. 185-192, 2002.

Oded Rabin et al., "Nanofabrication Using Self-Assembled Alumina Templates", Mat. Res. Soc. Symp Proc., vol. 636, pp. D4.7.1-D4.7.6, 2001.

James R. Lim et al., "Fabrication Method for Thermoelectric Nanodevices", Advanced Materials, vol. 17, pp. 1488-1492, 2005.

Eun Ju Bae et al., "Selective Growth of Carbon Nanotubes on Pre-patterned Porous Anodic Aluminum Oxide", Advanced Materials, vol. 14, pp. 277-279, 2002.

International Search Report dated Aug. 10, 2007.

* cited by examiner

METHOD FOR THE ELECTROLYTIC PRODUCTION OF SELF-SUPPORTING CONDUCTIVE NANOCOMPOSITE ELEMENTS

The invention relates to a method for depositing a nanostructured metal coating on an electronically conductive substrate and to the substrates thus coated.

BACKGROUND OF THE INVENTION

In the field of energy storage using batteries, the properties of the electrodes, and especially of the current collectors that the electrodes include, are an important element as regards the overall performance of the batteries. In order for a material to be able to be used as a collector, it is desirable for it to have a high electronic conductivity, good electrochemical stability and a large area of contact with the active material. Nanomaterials have a high area/volume ratio thereby increasing the reaction rates, by reducing the diffusional limitations, and the use of nanomaterials for production of current collectors is under development.

It is known to prepare nanostructured electrically conductive materials in the form of solid or hollow fibers using a porous membrane either electrochemically or chemically.

A chemical method is described for example by B. Bercu, et al. [Nuclear Instruments and Methods in Physics Research B 225, 497-502, (2004)]. The method consists in activating a polycarbonate membrane and then bringing it into contact with a solution of a copper precursor. After a sufficient contact time, so that copper is deposited on the walls of the pores of the membrane and also forms a layer on the surface of the membrane, the membrane is removed by dissolving it and what is obtained is a self-supporting element consisting of a copper layer bearing nanoelements in the form of hollow copper nanotubes on its surface. However, in that method, the copper layer forming a substrate obtained by electrochemical and/or chemical deposition in the case of the nanoelements is necessarily porous, and the length of the nanoelements in the final self-supporting element is dictated by the thickness of the membrane since the formation of the copper film on the surface of the membrane starts only when the surface of the pores of the membrane is completely covered with copper. Furthermore, the fact that the copper nanoelements on the copper substrate are hollow is unfavorable to the mechanical strength of the self-supporting element, and also to its use as a current collector, the quantity of current conveyed through the hollow elements being less than with solid nanoelements.

Methods are also known for depositing, electrochemically, a metallic coating of nanostructured elements on a conductive substrate. In these methods, it is necessary to pretreat the membrane that will be used as support for the formation of the nanostructured elements, so as to render said membrane conductive. The treatment generally consists in applying a film of noble metal by PVD or CVD to the membrane. This technique is complicated to implement on an industrial scale and makes the entire process expensive. Furthermore, it does not allow a self-supporting element consisting of just one metal to be obtained when the intended metal cannot be applied in film form by PVD or CVD.

For example, D. Dobrev, et al., [Nuclear Instruments and Methods in Physics Research B 149, 207-212, (1999)] describes a method for forming nanoscale metal needles electrochemically using a porous membrane. The method consists in applying a conductive film of Au on one face of a polycarbonate membrane by PVD, in electrodepositing a copper layer on the Au conductive film, then in depositing copper in the pores of the membrane via that face of the membrane that has remained free, and finally in dissolving the membrane using a suitable solvent. The self-supporting element obtained consists of a copper substrate bearing nanoscale copper needles, an Au film being interposed between the copper substrate and the nanoscale needles.

Y. Konishi, et al., [Journal of Electroanalytical Chemistry 559, 149-153, (2003)] describe a method for electrodepositing copper nanowires in a nanoporous polycarbonate membrane. In this method too, a conducting film (Pt—Pd) is deposited beforehand on the membrane, and then copper is electrodeposited. When the pores of the membrane are filled with copper, a copper layer forms on top, which layer acts as a cathode substrate during the electrodeposition. After the membrane has been dissolved, what is obtained is a self-supporting element consisting of a copper substrate bearing copper nanowires on the free end of which there may be a Pt—Pd film. The material of the substrate of such an element obtained by electrodeposition is porous, the porosity being inherent in the deposition process.

SUMMARY OF THE INVENTION

The object of the present invention is to provide a method for obtaining a self-supporting composite element consisting of an electronically conductive substrate coated with nanostructured metallic elements and which does not have the drawbacks of the methods of the prior art.

This is why the subject of the present invention is a method of producing a self-supporting element, the self-supporting composite element obtained, and various applications.

The method according to the present invention, for obtaining a self-supporting composite element consisting of an electronically conductive nonporous substrate coated with nanowires of metallic material, consists in carrying out an electrodeposition operation on a substrate through a porous membrane and then in dissolving the porous membrane. Said method is characterized in that it is implemented in an electrochemical cell connected to a controlled voltage and/or current source, and comprising:

a cathode consisting of the electronically conductive nonporous substrate to be coated, and connected to the negative terminal of the voltage and/or current source;

one or more anodes, each connected to the positive terminal of the voltage and/or current source;

an electrolyte consisting of a solution of a precursor compound of each constituent of the metallic material, said solution optionally containing an ionically conductive salt;

a plane porous membrane placed on the face or faces of the cathode; and a spacer element between each membrane and the anode that is adjacent it, the various parts constituting the cell being held in contact with one another.

FEG-SEM micrographs of the product obtained in Example 1 are shown in FIGS. 2 to 5.

Figure 2:
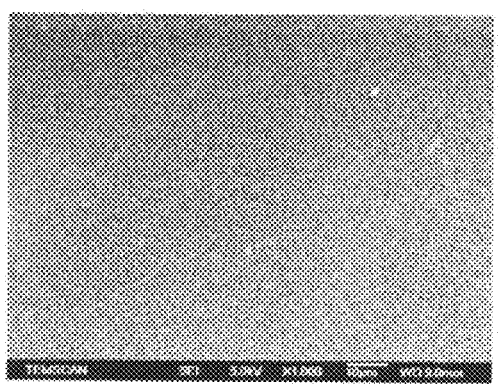
Figure 3:
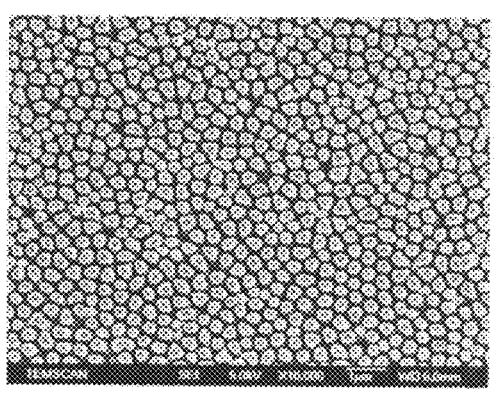
Figure 4:
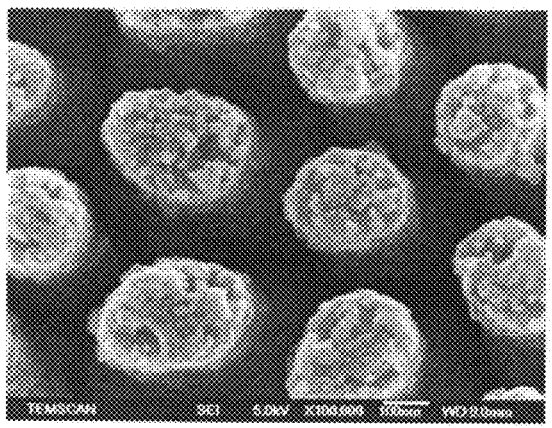
Figure 5:
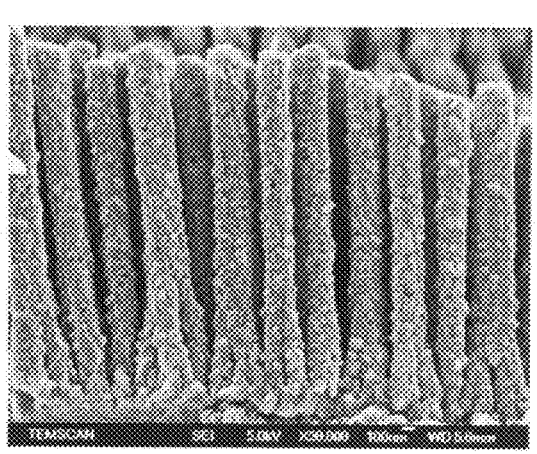

FIGS. 2 to 4 show a view of the product facing the ends of the nanocylinders with different magnifications (×1000, ×10000 and ×100000) and FIG. 5 shows a sectional view with a 30000 magnification.

Figure 6:
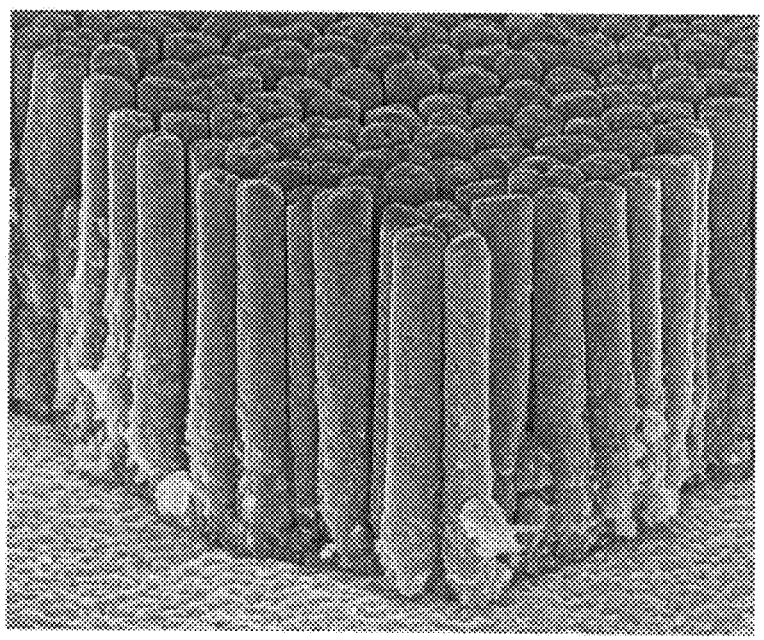

FIG. 6 shows an FEG-SEM micrograph of the product obtained in Example 3.

DETAILED DESCRIPTION OF THE PREFERRED EMBODIMENTS

The various parts constituting the cell may be kept in contact with one another by pressure. When the various parts are in a horizontal position and have sufficient weight, contact may result from gravity.

The electrolysis may be carried out with a constant, pulsed, alternating or oscillating current, or with a constant, pulsed, alternating or oscillating potential, or with a constant, pulsed, alternating or oscillating power.

The precursor of a component of the metallic material MM constituting the nanowires may be a precursor of a metal M, said metal M being chosen from Cu, Sn, Co, Fe, Pb, Ni, Cr, Au, Pd, Pt, Ag, Bi, Sb, Al and Li. When M is Al or Li, the precursor is used in solution in an organic solvent. When M is Cu, Sn, Co, Fe, Pb, Ni, Cr, Au, Pd, Pt, Sb, Ag or Bi, the precursor may be used in aqueous solution or in solution in an organic solvent. Preferably, the precursor is chosen from sulfates, sulfamates, borates, halides (more particularly chlorides and fluorides), cyanide-based or amine-based complexes, and hydrides. The organic solvent is preferably chosen from alkyl or dialkyl carbonates, such as for example propylcarbonate (PC), ethylcarbonate (EC) and diethylcarbonate (DEC).

In one particular embodiment, a complexing agent for the precursor of the metal M to be deposited is introduced into the electrolyte so as to reduce the rate of reduction of the metal M. This promotes the formation of a coating that is uniform and covering.

The ionically conductive salt of the electrolyte is chosen from electrochemically conductive salts that are stable under the electrolysis conditions. It may be a salt of the metal to be deposited. The addition of an ionically conductive salt is not essential. However, for low precursor concentrations, the conductivity of the electrolyte is low, or even unsatisfactory, and in this case it is useful to add a conductive salt to the electrolyte.

The cathode consists of a nonporous electronically conductive material chosen from materials that are chemically stable with respect to the electrolysis. For example, mention may be made of the metallic materials MM' formed by a metal M' chosen from Li, Zn, Cu, Sn, Co, Fe, Pb, Ni, Ti, Cr, Al, noble metals, such as for example Au, Ag, Pd and Pt, or by a metal alloy of several elements M'. It is particularly advantageous to use, as cathode, a foil of material obtained by rolling, by drawing, by calendering or by stamping.

The metal foil may for example be in the form of a plane foil or a foil folded in the form of a concertina. At least one of the two faces of the foil constituting the cathode faces an anode.

In one embodiment, the electrochemical cell contains a cathode, only one of the faces of which faces an anode. The nanowires are then deposited, during the electrolysis, on that face of the cathode facing the anode.

In another embodiment, the electrochemical cell contains two anodes in the form of thin foils, located on either side of a metal foil constituting the cathode. The foils constituting the anodes are parallel to the foil forming the cathode. The nanowires are then deposited simultaneously on both faces of the cathode.

In a preferred embodiment, a cathode consisting of a metal M' identical to the metal M of the precursor for the nanowires is used. The special case of a copper cathode and a copper precursor is particularly beneficial. Mention may also be made of the case of a nickel cathode and a nickel precursor, a zinc cathode and a zinc precursor, and a lead cathode and a lead precursor.

The porous membrane may for example be formed by an alumina foil, in which the pores are substantially in the form of nanoscale cylinders perpendicular to the plane of the membrane, by a polycarbonate (PC) foil or by a terephthalate (PET) foil. Foils of organic material generally have less regular and less ordered pores than alumina foils. During implementation of the method, the length of the nanowires formed in the pores of the membrane depends in particular on the duration of the electrolysis and on the concentration in the electrolyte of the precursor of the metal to be deposited. The membrane will be chosen in such a way that its thickness is equal to or greater than the desired length of the nanoparticles.

The alumina membranes in which the pores are substantially cylindrical, perpendicular to the surface of the membrane and uniformly distributed, are obtained by anodic oxidation of aluminum. They are sold for example under the name Anodisc by Whatman.

The PC or PET membranes may be obtained by presensitizing a PC or PET foil followed by perforation using a laser. PET membranes are for example sold by Whatman under the names Cyclopore and Nucleopore. PC membranes are for example sold by said company under the name Whatman Polycarbonate.

Polycarbonate membranes generally have sufficient mechanical strength for the spacer element to be able to be a simple element for creating a space between the membrane and the anode, said space containing the electrolyte.

Aluminum membranes generally have a low mechanical strength, and it is preferable to combine them with a spacer element of the separator type, consisting of a foil of an ionically conductive but electronically insulating material. As an example of a separator, mention may be made of a porous foil of cellulosic or polymeric material.

The purpose of the separator is not only to improve the mechanical strength of the membrane that is adjacent it, but also to increase the uniformity of nanowire deposition, owing to the penetration of the electrolyte by capillary effect into the membrane. This has the purpose of preventing the membrane from drying out. Furthermore, by using a membrane it is possible to have shorter inter-electrode distances than with a spacer.

The use of a noncontinuous porous membrane makes it possible to obtain a self-supporting element consisting of an electronically conductive nonporous substrate bearing a coating of nanostructured elements, in which the nanowire coating is not continuous. In this embodiment, a porous membrane in the surface of which cavities are provided is brought into contact with said substrate, said cavities having the shape and the area of the substrate surface regions that are intended not to be coated by the nanowires and that are masked before the electrolysis so as not to be subjected to the effects of the electrolytic process. The solid parts of the membrane are the image of the substrate regions that will be coated with nanoparticles. It is also possible to deposit nanowires noncontinuously by masking the membrane regions that correspond to the substrate region that must not be coated with nanowires.

In the electrochemical cell used for implementing the method of the invention, the anode may be of the soluble anode type, consisting of a metal identical to the metal M of the precursor for the nanowires, thereby making it possible to maintain a constant concentration of ions of the metal M in the solution and to limit the voltage across the terminals of the cell. The anode may also consist of a metal conductor that cannot be attacked in the solution, oxidation of the solvent therefore taking place on this conductor. The anode may furthermore be of the soluble anode type, consisting of a material other than the metal to be deposited, but in this case the electrolysis conditions must be adjusted so as to prevent deposition, on the cathode, of an alloy of the metal M and of the material constituting the anode.

Another subject of the present invention is the product obtained by the method defined above. This product is a self-supporting composite element consisting of a nonporous substrate made of an electronically conductive material which bears, on at least one of its faces, a coating consisting of nanowires of a metallic material, said nanowires being substantially oriented in a plane perpendicular to the substrate. The thickness and the shape of the substrate correspond to those of the cathode used to produce the composite element. The thickness of the substrate is preferably less than 1 mm, for example between 5 μm and 500 μm. The substrate may take the form of a plane foil, a foil folded in the form of a concertina, or a foil folded so as to form the side walls of a cylinder having for example a triangular or quadrilateral cross section.

A self-supporting composite element according to the present invention is distinguished from similar elements of the prior art, in which elements the substrate is obtained by electroplating or electroless plating on a porous membrane, not only by the absence of porosity but also by the orientation of the grains and of the roughness. In chemical deposition (electroplating or electroless plating), the material forming the substrate is deposited in the form of islands, the orientation of which is substantially perpendicular to the plane of the substrate.

Likewise, the roughness is oriented in the direction perpendicular to the plane of the substrate [cf. for example Y. C. Ee, et al., "Effect of processing parameters on electroless Cu seed layer properties", Thin Solid Films 462-463, 197-201, (2004) and N. M. Hassan, et al., "Temporal evolution of roughness in electroless copper films", (http://www.ene.unb.br/sbmicro/programcomplete.html)]. In the substrate of a self-supporting element according to the present invention, the general orientation of the roughness and of the grains is parallel to the plane of the substrate. These substrates therefore possess a particular texture oriented in the lamination plane, something which is not the case in the other electroless plating or electroplating processes.

The conductive material forming the substrate of the composite element is as defined above in the case of the cathode of the electrochemical cell used to implement the method of preparing the composite element. The metallic material forming the nanowires consists of a metal M chosen from Cu, Sn, Co, Fe, Pb, Ni, Cr, Au, Pd, Pt, Ag, Bi, Sb, Al and Li, or of an alloy of several metals M.

The length of the nanowires, that is to say the thickness of the coating, depends on the one hand on the length of the pores of the membrane and, on the other hand on the duration of the electrolysis. It is generally between a few hundred nanometers and a few tens of microns, for example from 500 nm to 100 μm. The use of a membrane consisting of an alumina foil in which the pores are substantially cylindrical and oriented perpendicular to the surface of the sheet forming the membrane makes it possible to obtain a substrate coated with substantially cylindrical elements oriented perpendicular to the surface of the substrate.

The use of a PC or PET membrane gives a coating consisting of cylindrical elements that are less regular and less well oriented with respect to the surface of the substrate, owing to a less regular distribution of the pores in this type of membrane.

The substrate may bear a coating of nanowires on only one of its faces, or on both faces.

In a composite element according to the invention, one face of the substrate may bear a coating of nanowires over its entire surface, or only in certain areas.

A composite element according to the present invention may be used either as a current collector or as an electrode, depending on the nature of the materials constituting, on the one hand, the substrate and, on the other hand, the coating formed by the nanowires. In both cases, the substrate is preferably formed by a thin film of conductive material having a thickness of a few tens of microns to a few hundred microns. Another subject of the present invention is consequently a current collector and an electrode comprising said composite element.

A self-supporting composite element according to the present invention, in which the metallic material MM constituting the nanowires has properties of an electrode active material, may be used directly as an electrode, without additional active material being added. As an example of such a composite element, mention may be made of a composite element in which the substrate consists of a material MM' chosen from Cu, Al, Li, Pb, Zn, Ni, Ti, Au, Ag, Pt and Pd, and the metallic material MM constituting the nanowires is chosen from Sn, Li, and $Ni_3Sn$, $Mg_2Sn$ and $Cu_2Sb$ alloys.

A self-supporting composite element according to the present invention, in which the metallic material MM constituting the nanowires does not have properties of an electrode active material, may be used as current collector for an electrode. When a self-supporting composite element according to the invention is intended to be used as a current collector, the substrate and the nanowire coating preferably consist of the same metal, chosen from Cu, Al, Li, Pb, Zn, Ni, Au, Ag, Pt and Pd.

Various methods may be used to produce an electrode from a current collector according to the invention.

According to a first embodiment, in which the material MM constituting the nanowires is readily oxidizable to an oxide having properties of an electrode active material, the current collector may be converted into an electrode by subjecting the nanowire coating to oxidation. What is therefore obtained is a self-supporting element formed by the substrate of initial material MM' and by an oxide nanowire coating having properties of an active material. As an example, mention may be made of an electrode comprising a substrate made of a material MM' carrying a tin oxide ($SnO$ or $SnO_2$), iron oxide ($FeO$, $Fe_2O_3$ or $Fe_3O_4$), nickel oxide or cobalt oxide nanowire coating obtained from a composite element according to the invention comprising a substrate of the material MM' and an Sn, Fe, Ni or Co nanowire coating, respectively.

In another embodiment, an electrode is produced from a current collector according to the invention by depositing electrode active material onto the nanowire coating.

The electrode active material may advantageously be deposited on the current collector by electroplating in an electrochemical cell in which the composite element acts as cathode, and the electrolyte consists of a precursor of the active material, under conditions that are within the competence of a person skilled in the art. To give an example of an electrode that can be obtained by this method, mention may be made of an electrode comprising a collector consisting of a copper substrate coated with copper nanowires, on which a film of Sn has been applied by electroplating.

The active material may also be deposited by impregnation or by coating, when the size of the particles of active material is smaller than the distance between the nanowires.

The active material may also be deposited by a sol-gel method, if the size of the particles to be deposited is smaller than the distance between the nanowires.

The active material may also be deposited by a physical method, by growing thin films, for example using sputtering or laser ablation techniques.

The current collectors and the electrodes according to the invention may be used in many electrochemical devices, such as lithium-ion rechargeable batteries, lithium/polymer rechargeable batteries, nonrechargeable generators, supercapacitors and electrochromic devices.

A lithium-ion battery comprises a negative electrode and a positive electrode separated by a liquid or gel electrolyte containing a lithium salt. Each of the electrodes consists of a material capable of reversibly inserting lithium ions.

The positive electrode of a lithium-ion battery may consist of a current collector comprising an Al substrate bearing a coating of Al nanowires and an active material consisting of a lithium-containing oxide, such as $LiCoO_2$, $LiNiO_2$ or $LiMn_2O_4$, or a phosphate, such as $LiFePO_4$. These active materials may advantageously be deposited on the Al/Al collector by impregnation or by coating.

The negative electrode of a lithium-ion battery may consist of a Cu collector and an active material chosen from Sn, $SnO_2$, Bi, an Ni—Sn alloy, an Sb-based alloy, an Fe oxide, a Co oxide or an Ni oxide.

An electrode comprising Sn, an Ni—Sn alloy or Bi as active material may advantageously be obtained by implementing the method of the invention with a copper substrate and an electrolyte containing an Sn precursor, a mixture of an Sn precursor and an Ni precursor, or a Bi precursor, respectively.

An electrode comprising an Sn, Fe, Co or Ni oxide as active material may advantageously be obtained by implementing the method of the invention with a copper substrate and an electrolyte containing an Sn, Fe, Co or Ni precursor respectively, or to obtain a composite element comprising a Cu substrate and nanowires of the metal corresponding to the precursor chosen, and then by subjecting the composite element to oxidation under the appropriate conditions.

A lithium-polymer battery comprises a negative electrode and a positive electrode separated by a solid polymer electrolyte containing a lithium salt. The anode consists of a lithium metal film or lithium alloy film. The cathode may advantageously be an electrode according to the invention, comprising a current collector consisting of an Al substrate bearing Al nanowires and a positive electrode active material chosen from the lithium-containing oxides mentioned in the case of the positive electrode of the cathode of the lithium-ion battery, and from non-lithium-containing oxides, such as for example, $V_2O_5$, said active material advantageously being deposited by impregnation or by coating.

A self-supporting composite element according to the present invention may advantageously be used to produce an electrode in a nonrechargeable battery, in which the electrolyte contains a lithium salt in solution in a liquid solvent. The anode consists of a lithium metal or lithium alloy film. The cathode may advantageously be an electrode according to the invention, comprising a current collector consisting of an Al substrate bearing Al nanowires and a positive electrode active material chosen from oxides, such as for example $V_2O_5$, $WO_3$ or $MnO_2$, sulfides, such as $FeS_2$, and carbon fluorides $CF_x$.

A supercapacitor comprises two electrodes separated by an electrolyte. One of the electrodes preferably consists of a material having a high specific surface area. Advantageously, such an electrode may be an electrode according to the invention, comprising a current collector consisting of an Al substrate bearing Al nanowires, or a Cu substrate bearing Cu nanowires, and an active material consisting, for example, of carbon or a polymer.

A composite element according to the present invention may furthermore be used in power electronics, and more generally in microelectronics, as an element for connecting the active components with their environment, or as a heat sink element, it being possible for the two functions to be combined. For these electronic applications, the method of the invention is implemented using as cathode the surface of a semiconductor element, at least one of the faces of which is at least partly covered by a metallization, and the membrane is placed on all or part of the metallization of the semiconductor element.

In one particular element, especially when the composite element is intended for a microelectronic device, a mask is applied to the free surface of the membrane so as to define areas of the semiconductor element that will be covered with nanowires (unmasked areas) and areas of the semiconductor element that will remain free (masked areas). This embodiment makes it possible to use the method on the entire surface of a semiconductor wafer at the end of clean room processing (front-end process).

When the method of the invention is used to produce connections between two semiconductor elements or between a semiconductor and an element of its environment, the use of a membrane bearing a mask allows the connection studs or bumps to be created on a semiconductor element. The semiconductor element will then be fastened to another semiconductor element or to an element of the environment via means well known to those skilled in the art, such as adhesives, solders, brazes or adhesive films (these commonly being denoted in the technical field as solders or tapes). The fastening operation may furthermore be carried out using direct methods, such as a thermocompression method or a thermosonic method. The choice of fastening mode will depend inter alia on the type of metal alloy used to fabricate the studs or bumps and on the receiving support (semiconductor element or element of the environment).

In the electronics field, interconnects may thus be produced, especially intra-substrate or intra-PCB (Printed Circuit Board) interconnects. They are used for example to interconnect chips buried in one and the same support, or to connect a chip with another element buried in the same support. An inorganic support is generally referred to as "substrate", while an organic support [of the epoxy resin/glass fiber type (type FR4) for example] is referred to as a PCB.

In the microelectronics field, die to die or die to package interconnections can be produced, or cooling of the dies and/or the package can be realized. The use of the method of the invention for these applications reduces inductances and increases the interconnect density.

When a composite element according to the invention is used as heat sink, the presence of the nanowire coating on one or both faces of the semiconductor element substantially increases the area for exchange with the air. The cooling performance is thus improved.

Of course, the two functions (interconnects and heat sink) may be combined in one and the same device within the context of 3D integration.

The present invention will be illustrated by specific exemplary embodiments described below, to which however, the invention is not limited.

Example 1

Deposition of Cu Nanowires on a Cu Substrate

The method was employed in an electrochemical cell containing an electrolyte in which an assembly, consisting of the following elements kept in contact with one another by pressure and stacked in the order mentioned, was immersed:
- copper foil, forming the cathode;
- alumina membrane;
- cellulose foil, forming the separator;
- copper foil, forming the anode.

The cathode and the anode were connected to the negative terminal and to the positive terminal, respectively of a potentiostat.

The copper foils forming the cathode and the anode respectively had a thickness of 500 μm.

The alumina membrane was a membrane sold under the name Anodisc by Whatman. It had a thickness of 50 μm and the diameter of the substantially cylindrical pores was 200 nm.

The electrolyte was an aqueous solution of (100 g/l) $CuSO_4$, 20 g/l $(NH_4)_2SO_4$ and 80 g/l DETA (diethylenetetraamine).

The electrolysis was carried out with current pulses repeating the "1 mA/cm$^2$ deposition for 250 ms, 20 mA/cm$^2$ deposition for 50 ms" sequence for 30 minutes.

Figure 1:
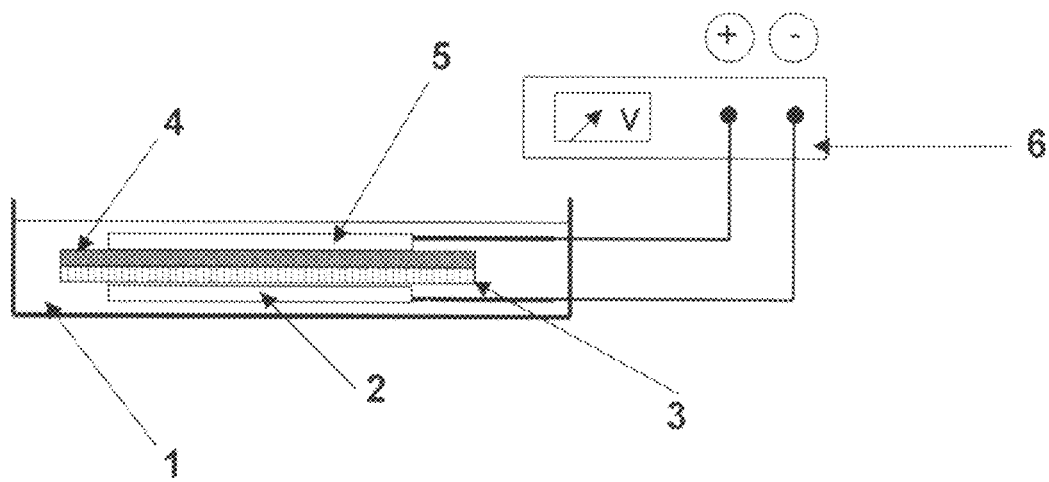
FIG. 1 provides a diagram of the device used in Example 1, in which (1) represents the electrolyte, (2) represents the cathode, (3) represents the membrane, (4) represents the separator, (5) represents the anode and (6) represents the potentiostat.

A diagram of the device used is shown in FIG. 1, in which (1) represents the electrolyte, (2) represents the cathode, (3) represents the membrane, (4) represents the separator, (5) represents the anode and (6) represents the potentiostat.

At the end of electrolysis, the cell was dismantled. The assembly formed by the cathode and the alumina membrane was immersed in a 1M sodium hydroxide solution at 80° C. for 30 seconds. After the membrane was dissolved, the cathode was rinsed for 10 s in an aqueous $H_2SO_4$ (1M)/$CuSO_4$ (1M) solution.

FEG-SEM micrographs of the product obtained are shown in FIGS. 2 to 5.

FIGS. 2 to 4 show a view of the product facing the ends of the nanocylinders with different magnifications (×1000, ×10000 and ×100000) and FIG. 5 shows a sectional view with a 30000 magnification.

Example 2

Deposition of Sn Nanowires on a Cu Substrate

The operating method of example 1 was repeated, using:
- a Cu foil having a thickness of 500 μm, forming the cathode;
- an Anodisc alumina membrane;
- an Sn foil having a thickness of 500 μm, forming the anode.

The electrolyte was an aqueous solution containing $SnSO_4$ (97 g/l), $HSO_4$ (30 g/L), tartaric acid (30 g/l), a PEG 3500 polyethylene glycol (0.35 g/l), gelatin (1 g/l) and $Na_2SO_4$ (30 g/l).

Example 3

Deposition of Copper Nanowires on a 3300 V/100 A IGBT Chip

The operating method of example 1 was repeated, using:
- a 3300 V/100 A IGBT (insulated-gate bipolar transistor) chip, forming the cathode;
- an Anodisc alumina membrane; and
- a Cu foil having a thickness of 500 μm forming the anode.

The electrolyte was an aqueous solution containing $SnSO_4$ (97 g/l), $H_2SO_4$ (30 g/l), tartaric acid (30 g/l), a PEG 3500 polyethylene glycol (0.35 g/l), gelatin (1 g/l) and $Na_2SO_4$ (30 g/l).

FIG. 6 shows an FEG-SEM micrograph of the product obtained.

The invention claimed is:

1. A method of producing a self-supporting composite element consisting of an electronically conductive nonporous substrate which bears, on at least one of its faces, a coating consisting of nanowires of a metallic material, wherein a precursor of each constituent of the metallic material constituting the nanowires is a precursor of a metal or metals M, the method comprising:
   carrying out an electrodeposition operation on said electronically conductive nonporous substrate through a plane porous membrane, and then
   dissolving the plane porous membrane,
   wherein the electrodeposition operation is implemented in an electrochemical cell connected to a controlled voltage and/or current source, said electrochemical cell comprising:
   a cathode consisting of the electronically conductive nonporous substrate to be coated, and connected to the negative terminal of said source, wherein the cathode consists of a metal or metals M', in which M' is identical to the metal or metals M of the precursor for the nanowires;
   one or more anodes, each connected to the positive terminal of said source;
   an electrolyte comprising a solution of the precursor of each constituent of the metallic material, said solution optionally containing an ionically conductive salt;
   a plane porous membrane placed on a single face or on each face of the cathode; and
   a spacer element between each plane porous membrane and the one or more anode that is adjacent it, wherein each spacer element covers the entire surface of the anode to which it is adjacent; and
   wherein the electrochemical cell is previously prepared by:
   stacking and holding in contact with one another by pressure the cathode, the plane porous membrane(s), the spacer element(s) and the anode(s), to provide an assembly capable of forming the composite element with the nanowire coating on either one face or both faces of the cathode, and
   immersing said assembly in the electrolyte prior to the step of carrying out the electrodeposition operation.

2. The method as claimed in claim 1, wherein the electrodeposition operation is carried out with a constant, pulsed, alternating or oscillating current, or with a constant, pulsed, alternating or oscillating potential, or with a constant, alternating, pulsed, alternating or oscillating power.

3. The method as claimed in claim 1, wherein in the precursor of metal or metals M, the metal or metals M are selected from the group consisting of Cu, Sn, Co, Fe, Pb, Ni, Cr, Au, Pd, Pt, Ag, Bi, Sb, Al and Li.

4. The method as claimed in claim 3, wherein when M is Al or Li, the precursor of the metal M is used in solution in an organic solvent, and when M is Cu, Sn, Co, Fe, Pb, Ni, Cr, Au, Pd, Pt, Sb, Ag or Bi, the precursor of the metal M is used in an aqueous solution or in solution in an organic solvent.

5. The method as claimed in claim 4, wherein the precursor is selected from the group consisting of sulfates, sulfamates, borates, halides, cyanide-based or amine-based complexes, and hydrides.

6. The method as claimed in claim 4, wherein the organic solvent is an alkyl or dialkyl carbonate.

7. The method as claimed in claim 1, wherein the metal or metals M' are selected from the group consisting of Li, Zn, Cu, Sn, Co, Fe, Pb, Ni, Cr, Al, Au, Ag, Pd and Pt.

8. The method as claimed in claim 1, wherein the cathode is a foil having areas with a flat surface.

9. The method as claimed in claim 1, wherein the one or more anodes consists of a metal identical to the metal or metals M of the precursor for the nanowires.

10. The method as claimed in claim 1, wherein the plane porous membrane or membranes are an alumina foil in which the pores are substantially in the form of nanoscale cylinders perpendicular to the plane of the cathode.

11. The method as claimed in claim 1, wherein the plane porous membrane or membranes are a porous polycarbonate (PC) foil or a porous terephthalate (PET) foil.

12. The method as claimed in claim 1, wherein the spacer element or elements are a foil of cellulosic or polymeric material.

13. The method as claimed in claim 1, wherein the electrochemical cell contains the one or more anodes and the cathode in thin film form.

14. The method as claimed in claim 1, wherein the electrochemical cell contains the cathode placed between two anodes, all three being in thin film form.

15. The method as claimed in claim 1, wherein a mask is applied to the free surface of the plane porous membrane or membranes so as to define areas of the nonporous substrate that will be covered with nanowires and areas of the nonporous substrate that will remain free of nanowires.

* * * * *